(12) United States Patent
Bao et al.

(10) Patent No.: US 9,293,412 B2
(45) Date of Patent: Mar. 22, 2016

(54) GRAPHENE AND METAL INTERCONNECTS WITH REDUCED CONTACT RESISTANCE

(71) Applicant: International Business Machines Corporation, Armonk, NY (US)

(72) Inventors: Junjing Bao, San Diego, CA (US); Griselda Bonilla, Fishkill, NY (US); Samuel S. Choi, Hopewell Junction, NY (US); Ronald G. Filippi, Wappingers Falls, NY (US); Naftali E. Lustig, Croton on Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/559,962

(22) Filed: Dec. 4, 2014

(65) Prior Publication Data

US 2015/0137377 A1    May 21, 2015

Related U.S. Application Data

(63) Continuation-in-part of application No. 13/716,636, filed on Dec. 17, 2012.

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/76802* (2013.01); *H01L 21/76805* (2013.01);
(Continued)

(58) Field of Classification Search
CPC .............. H01L 23/5226; H01L 23/53276; H01L 23/53266; H01L 23/53228; H01L 23/52361; H01L 21/76849; H01L 21/76871; H01L 21/76879; H01L 21/76802
See application file for complete search history.

(56) References Cited

U.S. PATENT DOCUMENTS

| | | |
|---|---|---|
| 5,149,420 A | 9/1992 | Buxbaum et al. |
| 5,470,788 A | 11/1995 | Biery et al. |

(Continued)

FOREIGN PATENT DOCUMENTS

| | | |
|---|---|---|
| CN | 102593098 A | 7/2012 |
| JP | 2009267371 A | 11/2009 |

(Continued)

OTHER PUBLICATIONS

Chen et al., "Intrinsic and Extrinsic Performance Limits of Graphene Devices on SiO2", Materials Research Science and Engineering Center, Center for Nanophysics and Advanced Materials, Department of Physics, University of Maryland, 22 pages.

(Continued)

*Primary Examiner* — Latanya N Crawford
(74) *Attorney, Agent, or Firm* — L. Jeffrey Kelly; Steven Meyers

(57) ABSTRACT

A structure including a first metal line in a first interconnect level, the first metal line comprising one or more graphene portions, a second metal line in a second interconnect level above the first interconnect level, the second metal line comprising one or more graphene portions, and a metal via comprising a palladium liner extends vertically and electrically connects the first metal line with the second metal line, the via is at least partially embedded in the first metal line such that the palladium liner is in direct contact with at least an end portion of the one or more graphene portions of the first metal line.

18 Claims, 12 Drawing Sheets

(52) U.S. Cl.
CPC .... *H01L21/76849* (2013.01); *H01L 21/76871* (2013.01); *H01L 21/76879* (2013.01); *H01L 23/53228* (2013.01); *H01L 23/53261* (2013.01); *H01L 23/53266* (2013.01); *H01L 23/53276* (2013.01); *H01L 21/76865* (2013.01); *H01L 2924/0002* (2013.01)

(56) References Cited

U.S. PATENT DOCUMENTS

| | | | |
|---|---|---|---|
| 6,597,067 | B1 | 7/2003 | Biery et al. |
| 7,259,463 | B2 | 8/2007 | Huang et al. |
| 7,492,046 | B2 | 2/2009 | Furukawa et al. |
| 7,572,682 | B2 | 8/2009 | Yang et al. |
| 7,598,127 | B2 | 10/2009 | Whitefield et al. |
| 7,745,810 | B2 | 6/2010 | Rueckes et al. |
| 7,787,292 | B2 | 8/2010 | Keshavarzi et al. |
| 8,101,529 | B2 | 1/2012 | Narita |
| 8,237,142 | B2 | 8/2012 | Cheung et al. |
| 8,378,335 | B2 | 2/2013 | Yamazaki et al. |
| 8,426,309 | B2 | 4/2013 | Ward et al. |
| 8,463,090 | B2 | 6/2013 | Donval et al. |
| 8,476,765 | B2 | 7/2013 | Zhang et al. |
| 8,482,126 | B2 | 7/2013 | Wada et al. |
| 8,647,978 | B1 | 2/2014 | Ott et al. |
| 8,735,242 | B2 | 5/2014 | Zhu |
| 2004/0217481 | A1 | 11/2004 | Farrar |
| 2004/0253805 | A1* | 12/2004 | Dubin et al. ............. 438/618 |
| 2007/0023914 | A1 | 2/2007 | Farrar |
| 2007/0176255 | A1 | 8/2007 | Kreupl et al. |
| 2008/0197496 | A1* | 8/2008 | Mori et al. ............... 257/751 |
| 2008/0296728 | A1 | 12/2008 | Yang et al. |
| 2010/0021708 | A1 | 1/2010 | Kong et al. |
| 2011/0006425 | A1 | 1/2011 | Wada et al. |
| 2011/0059599 | A1 | 3/2011 | Ward et al. |
| 2011/0091647 | A1 | 4/2011 | Colombo et al. |
| 2011/0101528 | A1 | 5/2011 | Akimoto et al. |
| 2011/0115094 | A1 | 5/2011 | Darnon et al. |
| 2011/0254082 | A1 | 10/2011 | Jang |
| 2012/0006580 | A1 | 1/2012 | Sandhu |
| 2012/0080661 | A1 | 4/2012 | Saito et al. |
| 2012/0080662 | A1 | 4/2012 | Saito et al. |
| 2012/0080796 | A1 | 4/2012 | Wada et al. |
| 2012/0139114 | A1 | 6/2012 | Zhang et al. |
| 2012/0205626 | A1 | 8/2012 | Dimitrakopoulos et al. |
| 2012/0228614 | A1 | 9/2012 | Kitamura et al. |
| 2012/0261165 | A1 | 10/2012 | Durocher et al. |
| 2013/0015581 | A1 | 1/2013 | Wann et al. |
| 2013/0056873 | A1* | 3/2013 | Wada et al. ............... 257/746 |
| 2013/0059134 | A1 | 3/2013 | Chai et al. |
| 2013/0113102 | A1 | 5/2013 | Bao et al. |
| 2013/0203222 | A1 | 8/2013 | Chung et al. |
| 2013/0217226 | A1* | 8/2013 | Kitamura et al. .......... 438/652 |
| 2014/0070425 | A1 | 3/2014 | Wada et al. |
| 2014/0138829 | A1 | 5/2014 | Zhao et al. |

FOREIGN PATENT DOCUMENTS

| | | |
|---|---|---|
| KR | 20070097764 A | 10/2007 |
| WO | 2013052679 A1 | 4/2013 |
| WO | 2014099428 A1 | 6/2014 |

OTHER PUBLICATIONS

Pending U.S. Appl. No. 13/716,636, entitled "Graphene and Metal Interconnects", filed Dec. 17, 2012.

Yu et al., "Bilayer Graphene/Copper Hybrid On-Chip Interconnect: A Reliability Study", IEEE Transactions on Nanotechnology, vol. 10, No. 4, Jul. 2011, pp. 710-714.

Li et al., "Graphene Films with Large Domain Size by a Two-Step Chemical Vapor Deposition Process", NANO Letters, 2010, vol. 10, pp. 4328-4334, American Chemical Society.

Li et al., "Low-Temperature Growth of Graphene by Chemical Vapor Deposition Using Solid and Liquid Carbon Sources", vol. 5, No. 4, pp. 3385-3390, 2011, ACSNANO.

Mattevi et al., "A review of chemical vapour deposition of graphene on copper†", www.rsc.org/materials, Journal of Materials Chemistry, 2011, vol. 21, pp. 3324-3334.

Murali et al., "Breakdown current density of graphene nanoribbons", Applied Physics Letters vol. 94, 2009, American Institute of Physics, pp. 243114-1-243114-3.

"New Graphene Fabrication Method uses Silicon Carbide Templates to Create Desired Growth", ScienceNewsline Technology, http://www.sciencenewsline.com/summary/2010100512000020.html, Accessed on Jul. 29, 2014, pp. 1-2.

Pollard, "Growing Graphene via Chemical Vapor Deposition", Department of Physics, Pomona College, May 2, 2011, pp. 1-47.

Yarris, "Graphene Films Clear Major Fabrication Hurdle", Apr. 8, 2010, News Center, http://newscenter.lbl.gov/2010/04/08/graphene-films/, Accessed on Aug. 1, 2014, pp. 1-5.

Robertson et al., "Use of carbon nanotubes for VLSI interconnects", Diamond & Related Materials vol. 18, 2009, pp. 957-962.

Xia et al., "The origins and limits of metal-graphene junction resistance", Nature Nanotechnology, Articles, vol. 6, Mar. 2011, www.nature.com/naturenanotechnology, pp. 179-184.

Sutter et al., "Graphene growth on epitaxial Ru thin films on sapphire"; Received Oct. 6, 2010; accepted Oct. 29, 2010, published online Nov. 23, 2010, doi:10.1063/1.3518490, Copyright 2010 American Institute of Physics.

Pending U.S. Appl. No. 14/454,765, entitled: "Graphene-Metal E-Fuse", filed Aug. 8, 2014.

U.S. Appl. No. 13/551,962; entitled; "Use of Graphene to Limit Copper Surface Oxidation, Diffusion and Electromigration in Interconnect Structures"; filed Jul. 18, 2012.

"Patent Cooperation Treaty International Search Report", Applicant International Business Machines Corporation, PCT/US2013/073773, filing date Dec. 9, 2013.

Pending U.S. Appl. No. 13/873,356, entitled: "Hybrid Graphene-Metal Interconnect Structures", filed Apr. 30, 2013.

Blech, "Erratum: Electromigration in thin aluminum films on titanium nitride", Journal of Applied Physics. vol. 48, No. 6, Jun. 1977, 2 pages.

Khatami et al., "Metal-to-Multilayer-Graphene Contact—Part I: Contact Resistance Modeling", IEEE Transactions on Electron Devices, vol. 59, No. 9, Sep. 2012, pp. 2444-2452.

Kwon et al., "Growth of Semiconducting Graphene on Palladium", NANO Letters, 2009, vol. 9, No. 12, pp. 3985-3990.

Ohno, "Electroless Deposition of Palladium and Platinum", Modern Electroplating, Fifth Edition, 2010, pp. 477-482.

Ohno, "Electroless Deposition of Palladium and Platinum", Modem Electroplating, Fifth Edition, 2010, pp. 477-482.

* cited by examiner

US 9,293,412 B2

GRAPHENE AND METAL INTERCONNECTS WITH REDUCED CONTACT RESISTANCE

CROSS REFERENCE

The present application is a continuation-in-part of and claims priority under 35 U.S.C. §120 of U.S. patent application Ser. No. 13/716,636, filed on Dec. 17, 2012, which is incorporated by reference in its entirety. Moreover, U.S. patent application Ser. No. 13/873,356, titled Hybrid Graphene-Metal Interconnect Structures, filed on Apr. 30, 2013 and U.S. patent application Ser. No. 14/454,765, titled Graphene-Metal E-Fuse, filed on Aug. 8, 2014 are also hereby incorporated by reference.

BACKGROUND

The present invention relates generally to the field of semiconductor structure and a method of forming the same, and more particularly to reducing the contact resistance of a back-end-of-the line (BEOL) interconnect structure primarily composed of graphene and metal.

Integrated circuit(s) typically include a plurality of semiconductor devices and interconnect wiring. Networks of metal interconnect wiring typically connect the semiconductor devices from a semiconductor portion of a semiconductor substrate. Multiple levels of metal interconnect wiring above the semiconductor portion of the semiconductor substrate are connected together to form a back-end-of-the line (BEOL) interconnect structure. Within such a structure, metal lines run parallel to the substrate and metal vias run perpendicular top the substrate.

Two developments in the last decade have contributed to increased performance of contemporary ICs. One such development is the use of copper as the interconnect metal of the BEOL interconnect structure. Copper is advantageous because it has a higher conductivity compared with other traditionally used interconnect metals such as, for example, aluminum. However, when compared to copper, other materials such as graphene have superior current carrying capacities and thermal conductivity, but many methods of producing graphene have presented numerous challenges which discouraged the inclusion of graphene in contemporary ICs.

SUMMARY

According to one embodiment of the present invention, a structure is provided. The structure may include a first metal line in a first interconnect level, the first metal line comprising one or more graphene portions, a second metal line in a second interconnect level above the first interconnect level, the second metal line comprising one or more graphene portions, and a metal via comprising a palladium liner extends vertically and electrically connects the first metal line with the second metal line, the via is at least partially embedded in the first metal line such that the palladium liner is in direct contact with at least an end portion of the one or more graphene portions of the first metal line.

According to another embodiment, a method is provided. The method may include forming a first metal line in a first interconnect level, the first metal line comprising one or more graphene portions, forming a second metal line in a second interconnect level above the first interconnect level, the second metal line comprising one or more graphene portions, and forming a metal via comprising a palladium liner extends vertically and electrically connects the first metal line with the second metal line, the via is at least partially embedded in the first metal line such that the palladium liner is in direct contact with at least an end portion of the one or more graphene portions of the first metal line.

According to another embodiment, a method is provided. The method may include etching, in a first dielectric layer, a first trench, filling the first trench with graphene, etching in a second dielectric layer a via opening, the second dielectric layer is above the first dielectric layer, and at least an end portion of the graphene in the first trench is exposed along a sidewall at a bottom of the via opening, and depositing, conformally, a layer of palladium within the via opening. The method may further include filling the via opening with a conductive interconnect material, etching, in the second dielectric layer, a second trench which intersects with, and at least partially removes a portion of, the conductive interconnect material in the via opening, and filling the second trench with graphene.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
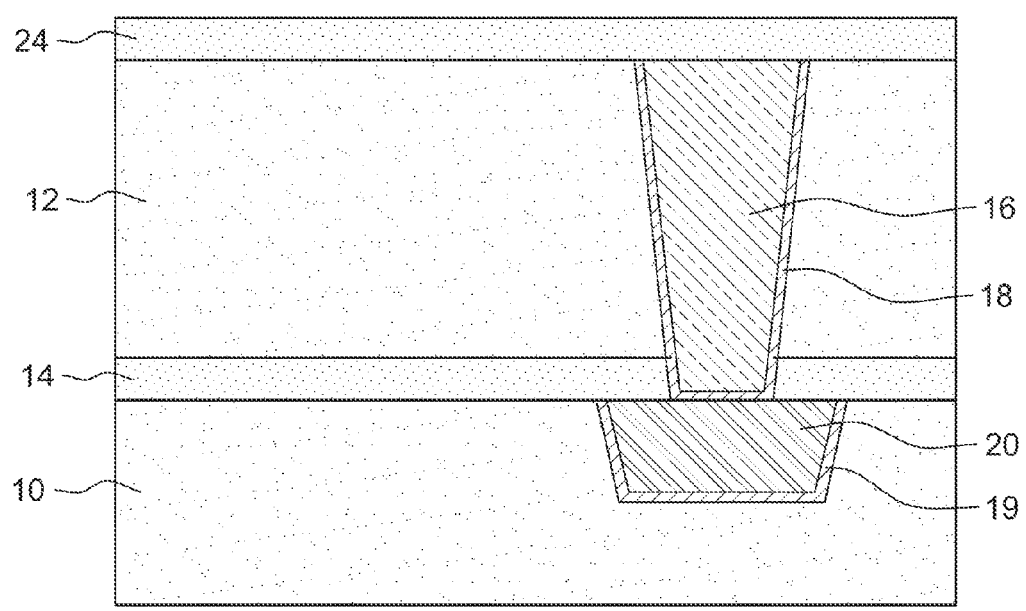
FIG. 1 illustrates a starting graphene and metal interconnect structure including a component and via according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In the fabrication/manufacture of integrated circuit chips, there is a growing desire to fit more devices and circuits within each chip along with higher levels of energy efficiency. As such, there is a constant need to not only reduce the size of the circuit components, but also to reduce the size and resistance of wiring and connecting vias interconnected to the circuit components and the spacing (pitch) between one VIA (and connecting wire) to another VIA (and connecting wire) on the same level. These wires and VIAs may be disposed of in one or more metallization layers formed on top of a semiconductor substrate.

The semiconductor substrate is preferably, but not necessarily, made up of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate may also be made up of other semiconductor materials, such as germanium, and compound semiconductor substrates, such as type III/V semiconductor substrates, e.g., GaAs. Although the semiconductor substrate is often depicted as a bulk semiconductor substrate, semiconductor on insulator (SOI) substrate arrangements, such as silicon on insulator substrates, are also suitable substrates for use in an integrated circuit chip.

The substrate may include one or more circuit components or devices, such as transistors, capacitors, or resistors formed thereon. In other exemplary embodiments, other types of circuit components or devices may be used.

A metallization layer is wiring (conductive lines) embedded in a dielectric material. Multiple metallization layers are often put together and interconnected through conventional vias, which pass through the dielectric material to contact metal wires on separate levels. A metallization layer may also be referred to herein as a metal layer, a wiring layer, or a wiring level. The vias, metal layer, the wiring layer, or wiring level together may be called the interconnect structure or the Back End of Line (BEOL) wiring levels.

A dielectric layer may include both an upper portion, i.e., the dielectric material in which wiring is formed, and a lower portion, i.e., the dielectric material in which conductive vias are formed. The lower portion serves as an inter-level dielectric (ILD) layer while the upper portion serves as an intra-metal dielectric (IMD) layer. The dielectric layer can be a single layer or a multi-layered stack. For example, a single layer can be used to serve as both the ILD and IMD or separate layers are used for the ILD and IMD. In another example, an etch stop layer (a layer of material typically placed underneath the material to be etched to stop the etching process) can be disposed between the ILD and IMD.

The conductive material used to create the wiring (conductive lines) may be a metal, such as tungsten, copper, aluminum, respective alloys, or combinations thereof. Conductive vias may be made up of the same or different materials from the wiring. Vias may connect the conductive line to contact regions below. Depending on the dielectric layer level, the contact region can be another conductive line in a lower dielectric layer or the contact region can be a device, such as a diffusion region, a gate of a transistor, or a plate of a capacitor.

Wiring and vias are typically made using photo lithography processing. In conventional photo lithography processing, a photo resistant masking material (photoresist) is disposed over one or more layers of a dielectric material. A masking step is performed to selectively remove photo resist material from certain regions (i.e., via hole locations and wiring paths) of the dielectric material, which are left exposed. An etch process follows, which etches away the exposed portions of the dielectric material forming trenches and via holes therein. A metal deposition process fills these portions with conductive material to form the wiring and vias of a layer.

More specifically, the masking step performed involves focusing light, through a mask image, onto the surface of the photo resist layer. Due to focusing and light wavelength constraints, there is a limitation on how small an image can be formed.

To create wiring and vias with smaller critical dimensions (CD), less than 40 nm for example, and tighter pitches, less than 80 nm for example, the mask images must be created on a sub-lithographic scale (i.e., of a size smaller than can be produced using conventional lithographic processes). In addition, smaller CD and tighter grouping allow for little error in forming the vias and connecting wires. As such, it is desirable to have a process where vias self-align themselves to their respective metal lines during their creation.

Initially, aluminum was the metal of choice for many methods used for the fabrication/manufacture of integrated circuit chips. However, aluminum has higher electrical resistance than silver or copper, which have nearly half of the resistance of aluminum. The cost and ease of use made copper a better choice for fabrication/manufacture of integrated circuit chips. Unfortunately, copper introduced a number of new challenges. Because of the lack of volatile copper compounds, copper could not be patterned by the techniques of photoresist masking and plasma etching that had been used with great success with aluminium. The inability to plasma etch copper called for a drastic rethinking of the metal patterning process and the result of this rethinking was a process referred to as an additive patterning or a "Damascene" or "dual-Damascene" process.

In this process, the underlying silicon oxide insulating layer is patterned with open trenches where the conductor is located. A thick coating of copper that significantly overfills the trenches is deposited on the insulator, and chemical-mechanical planarization (CMP; also called chemical-mechanical polishing) is used to remove the copper to the level of the top of the insulating layer. Copper sunken within the trenches of the insulating layer is not removed and becomes the patterned conductor. With multiple applications of this process a number of layers can be built up to form complex structures.

Figure 6:
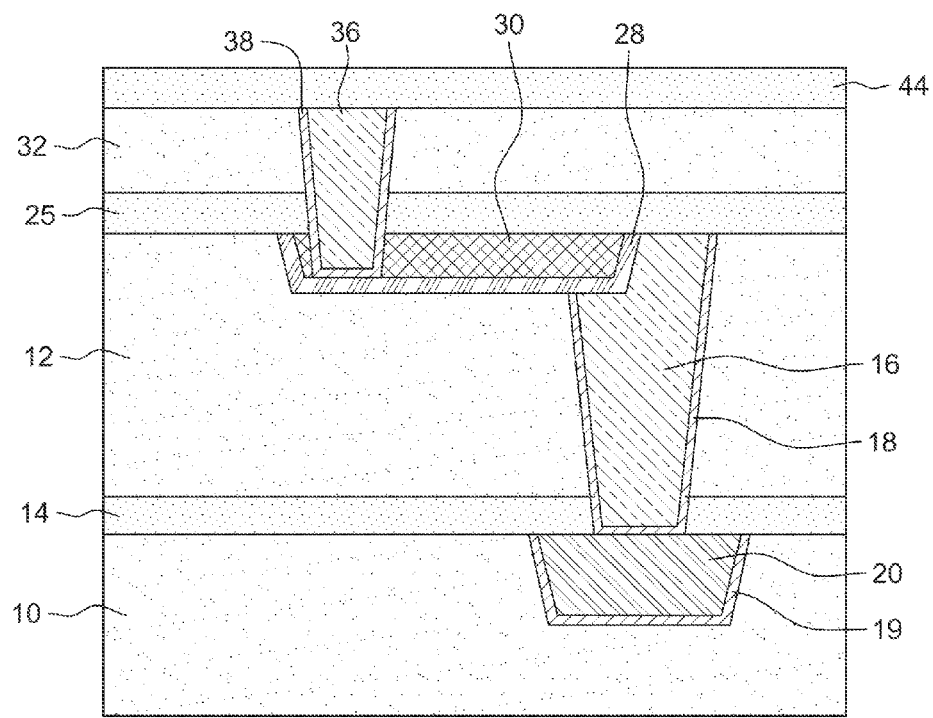
FIG. 6 illustrates a final structure according to another exemplary embodiment.
Figure 7:
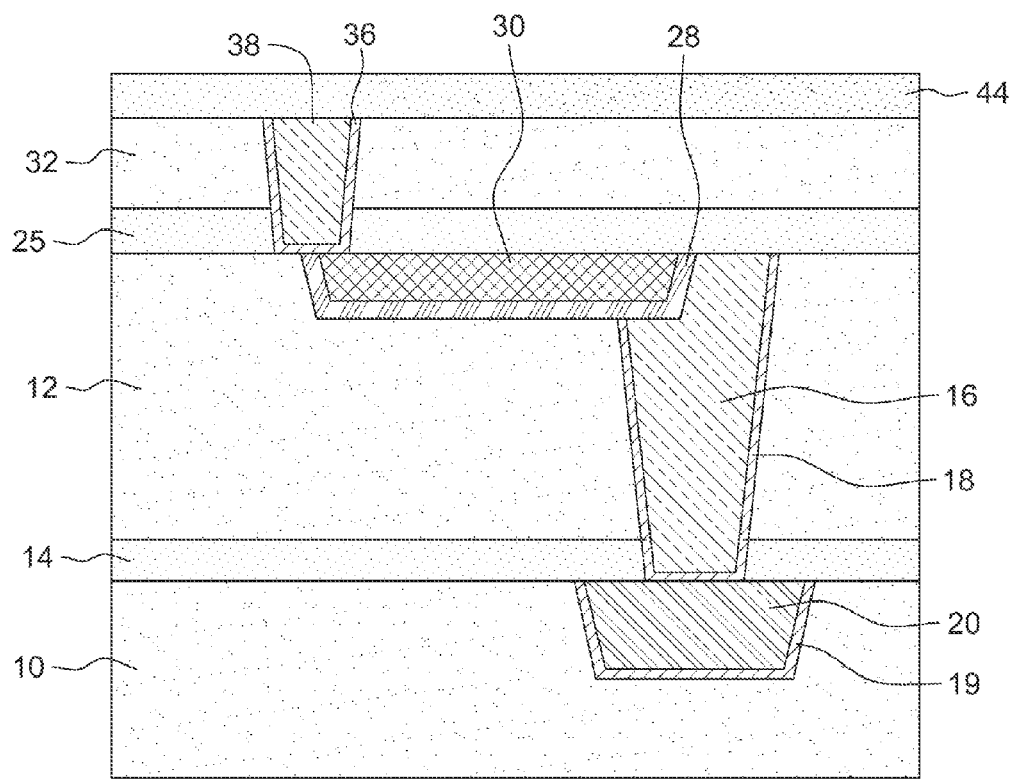
FIG. 7 illustrates a final structure according to another exemplary embodiment.

Referring to FIG. 1, in accordance with an exemplary embodiment, there is illustrated a substrate 10, 12 that is employed in one embodiment of the present invention. Similarly, layer 32 depicted in FIGS. 6 and 7 illustrates a substrate. Substrates 10, 12, and 32 may comprise a semiconductor material, an insulator material, a conductive material, or any combination thereof including multilayers. When substrates 10, 12, and 32 are comprised of a semiconductor material, any semiconductor such as, for example, Si, SiGe, SiGeC, SiC, Ge alloys, GaAs, InAs, InP and other III/V or II/VI compound semiconductors may be used. In addition to these listed types of semiconducting materials, substrate 10,12, and 32 can also be a layered semiconductor substrate such as, for example, Si/SiGe, Si/SiC, silicon-on-insulators (SOIs) or silicon germanium-on-insulators (SGOIs).

In accordance with an exemplary embodiment, when substrate 10, 12, and 32 comprises a semiconductor material, one or more semiconductor devices such as, for example, complementary metal oxide semiconductor (CMOS) devices can be fabricated thereon.

In accordance with an exemplary embodiment, when substrate 10, 12, and 32 is an insulator material, the insulator material can be an organic insulator, an inorganic insulator or a combination thereof including multilayers. When substrate 10,12, and 32 is a conductive material, substrate 10,12, and 32 may include, for example, polySi, an elemental metal, alloys of elemental metals, a metal silicide, a metal nitride or combinations thereof including multilayers. When substrate 10, 12, and 32 comprises a combination of an insulator material and a conductive material, substrate 10, 12, and 32 may represent a first interconnect level of a multilayered interconnect structure.

As depicted in FIG. 1, in accordance with an exemplary embodiment, layers 14 and 24 are etch stop (or etching retardant) layers that can be employed in one embodiment of the present disclosure. Similarly, layers 25 and 44 depicted in FIGS. 6 and 7 illustrate etch stop layers. In this disclosure the etch stop layers are composed of silicon carbon nitride (SiCN), a copper passivation and etch stop material. In general, a layer of "etch stop" material is typically placed underneath the material to be etched to stop the etching process. Each of etch stopping layers 14, 24, 25 and 44 can be composed of material, known in the art, which feature different etch characteristics than the material to be etched (e.g., substrate 12).

In this exemplary embodiment, substrate 10 includes a component 20. In general, component 20 is a structure that requires routing or connection to an interconnect. Component 20 is, in this embodiment, a macrocell connected to the bottom of a vertical interconnect access (VIA) 16. VIA 16 is composed of a copper core surrounded on three sides by a barrier metal 18. In this example, component 20 is also surrounded by a barrier metal (19). In another example depicted in FIGS. 6 and 7, VIA 36 is composed of a copper core and is surrounded by a barrier metal 38 on three sides. In this embodiment, VIA 16 and VIA 36 are structures that form an electrical connection capable of carrying a signal between two or more layers (e.g., substrates 10 and 12). In other embodiments, the core of a VIA can be filled with elemental forms or alloys including copper, aluminum, silver, gold, calcium, platinum, tin, lithium, zinc, nickel, and tungsten.

In this exemplary embodiment, barrier metal 18, 19, and 38 are materials used in integrated circuits to chemically isolate semiconductors from soft metal interconnects, while maintaining an electrical connection between them. For instance, a layer of barrier metal must surround every copper interconnection in modern copper-based chips, to prevent diffusion of copper into surrounding materials, since diffusion of copper into surrounding materials can degrade their properties. Some materials that have been used as barrier metals include cobalt, ruthenium, tantalum, tantalum nitride, indium oxide, tungsten nitride, and titanium nitride (the last four being conductive ceramics, but "metals" in this context).

Figure 2:
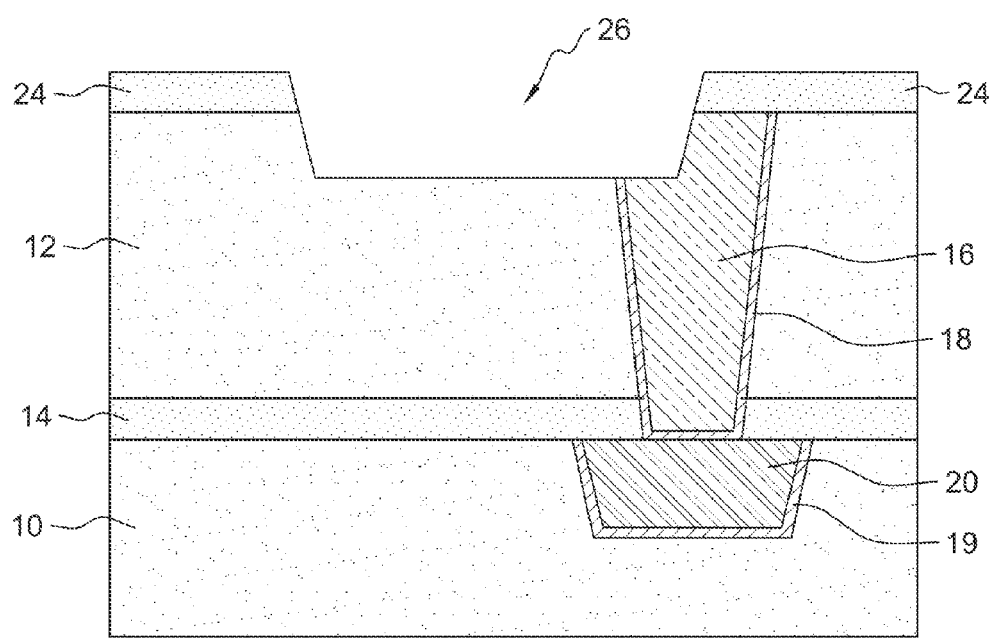
FIG. 2 illustrates the formation of a trench according to an exemplary embodiment.

Referring now to FIG. 2, in accordance with an exemplary embodiment, a trench 26 is etched (e.g., using lithography) through etch stop layer 24 and into substrate layer 12. The right end of trench 26 intersects VIA 16 and barrier metal 18 such that a portion of VIA 16 and barrier metal 18 have been removed, thereby exposing copper core of VIA 16.

Figure 3:
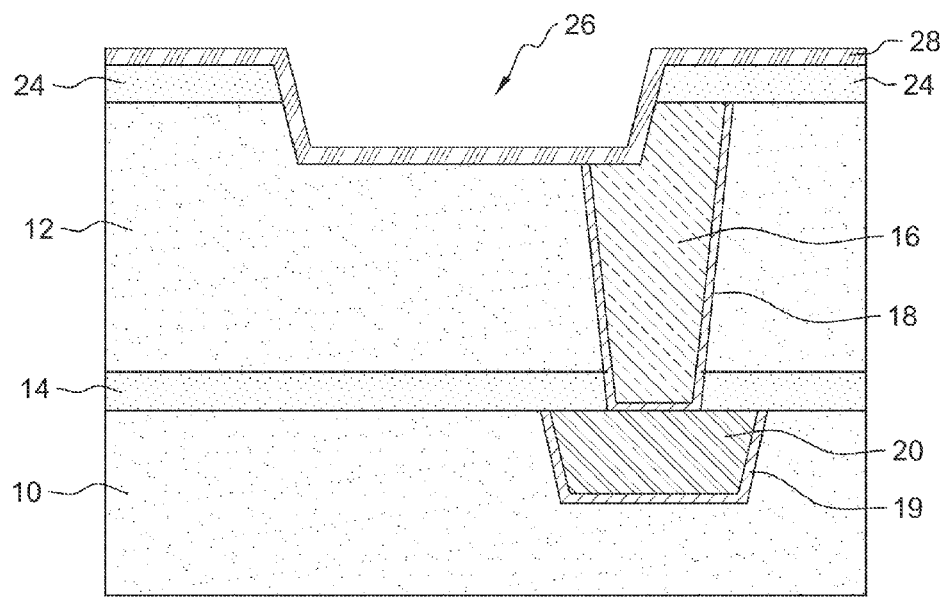
FIG. 3 illustrates depositing a liner layer according to an exemplary embodiment
Figure 4:
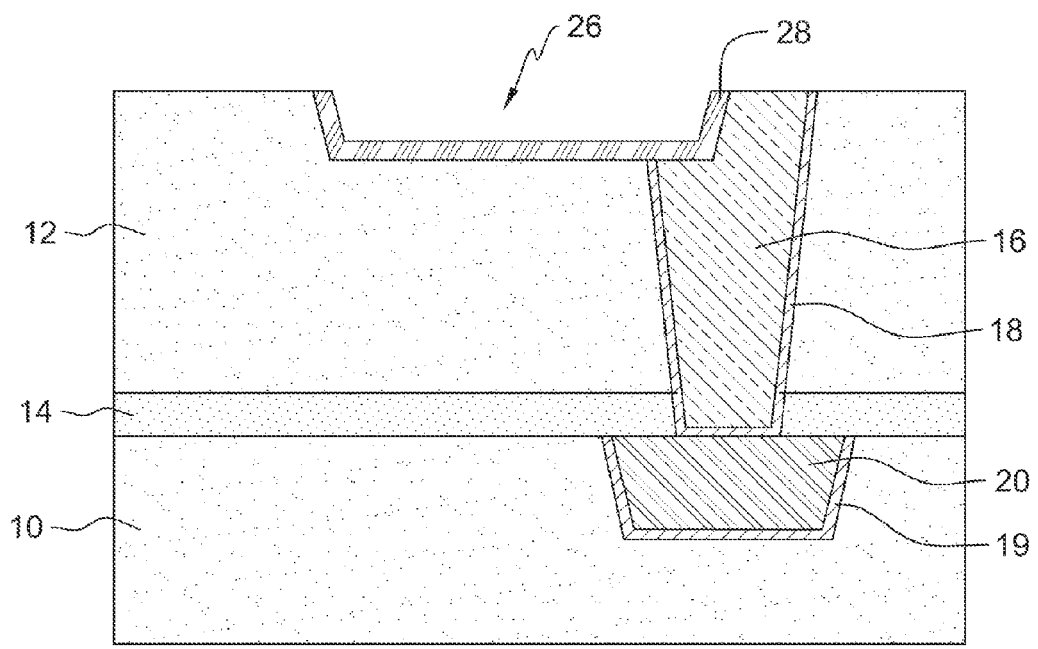
FIG. 4 illustrates a polishing technique according to an exemplary embodiment

Referring now to FIG. 3, in accordance with an exemplary embodiment, a tantalum nitride (TaN) layer has been applied followed by a layer of ruthenium (Ru), and both layers combined compose liner layer 28. The tantalum nitride (TaN) layer facilitates the adherence of the ruthenium to substrate 12. Ruthenium, in this exemplary embodiment, is a graphene catalyst, i.e., a catalyst that aids in the growth of graphene in trench 26 (see below). In other embodiments other elements or materials, including alloys, can be substituted for the ruthenium catalyst such as nickel, palladium, iridium, and copper. After liner layer 28 is deposited, excess and/or unwanted material is removed by the process of CMP. In an example, as depicted in FIG. 4, etch stop layer 24 and a portion of liner layer 28 are removed by the process of CMP.

Figure 5:
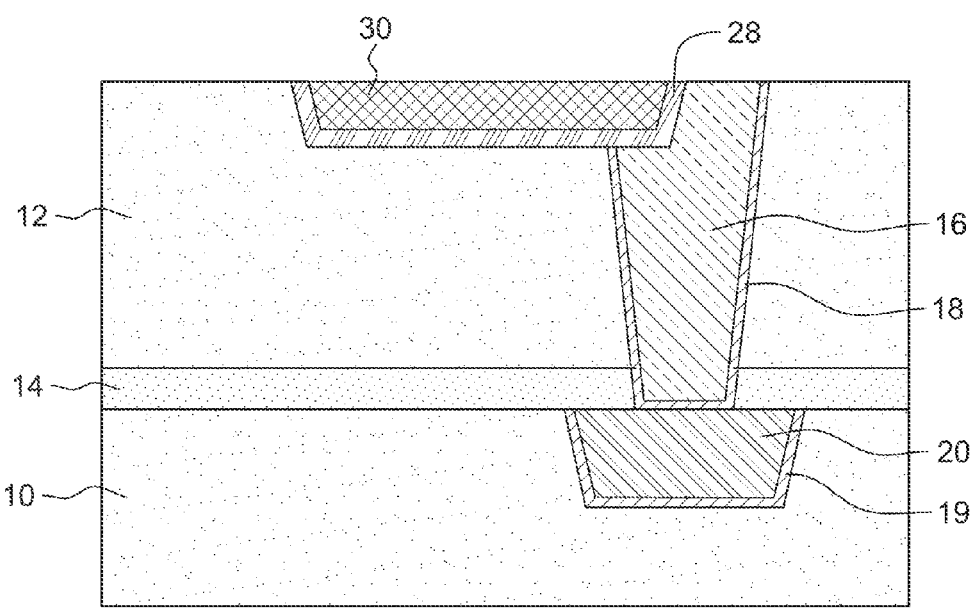
FIG. 5 illustrates filling the trench with graphene to form a final structure according to an exemplary embodiment

Referring now to FIG. 5, in accordance with an exemplary embodiment, the selective growth of multiple layers of graphene (i.e., multilevel or multilayer), herein referred to as graphene 30, is illustrated. In this embodiment, the multiple layers of graphene are grown, using chemical vapor deposition (CVD), from both solid and liquid carbon sources, and at a temperature between 300° C.-400° C. Multilayer graphene 30 connects to VIA 16, using liner layer 28, creating an electrical connection that can carry current along each horizontal layer of graphene. In other embodiments current may travel from one graphene layer into another. However, there is generally higher electrical resistance between individual graphene layers. In yet other embodiments, the temperature at which the graphene is grown, using different catalysts than those referenced in this disclosure, can be above and/or below the range of 300° C.-400° C.

Referring now to FIG. 6, in accordance with an exemplary embodiment, another layer of etch stop material (25) is added followed by another substrate layer (32). A trench is etched through substrate layer 32 and etch stop material 25. The trench is etched such that the trench intersects the left end of the graphene 30 and does not penetrate through, but is in contact with, liner layer 28 (TaN/Ru layer). The trench is then lined with barrier metal 38, filled with a copper core, thereby creating VIA 36, and capped with etch stop (or etching retardant) layer 44. Thus, component 20 is connected to two VIAs with a graphene connector forming an electrical connection therebetween.

In general, the process of creating VIAs and graphene structures can be continued until the routing or desired connections are formed. In other embodiments, the exact process by which VIAs and graphene layers are created can vary. For example, a VIA can include a number of various core and/or barrier metals, and number of metals can be used as a catalyst for the growth of graphene (e.g., palladium).

Referring now to FIG. 7, an alternative exemplary embodiment is shown. In the alternative embodiment, a VIA opening is formed through substrate layer 32 and etch stop material 34 and is aligned such that it intersects a portion of liner layer 28. As shown in FIG. 7, the VIA opening does not go to the bottom of the graphene 30 trench, but preferably contacts the top of the graphene 30 trench. The via opening is then lined with barrier metal 36, filled with a core comprising copper 38, thereby creating VIA 36. The structure is capped with etch stop (or etching retardant) layer 44. In this embodiment, the bottom end of VIA 36 is in electrical contact with liner layer 28 (which provides a vertical electrical pathway) on a sidewall of the graphene 30 connector and the topmost layer of the graphene 30 connector. Thus, component 20 is connected to two VIAs with a graphene connector forming an electrical connection therebetween.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating graphene and metal interconnect structures (which are intended to be illustrative and not limiting), it is noted that modifications and variations may be made by persons skilled in the art in light of the above teachings.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

In an alternative embodiment, the hybrid graphene metallization scheme described above may be improved by lowering the contact resistance where the graphene intersects with the metal. More specifically, in embodiments in which a metal interconnect structure extends, at least partially, into the graphene line, for example as described above with reference to FIG. 6, an additional liner may be added between the metal via and the graphene to lower the interfacial contact resistance. One embodiment by which to fabricate the hybrid graphene interconnect structure having a lower contact resistance, is described in detail below by referring to the accompanying drawings FIGS. 8-12.

Figure 8:
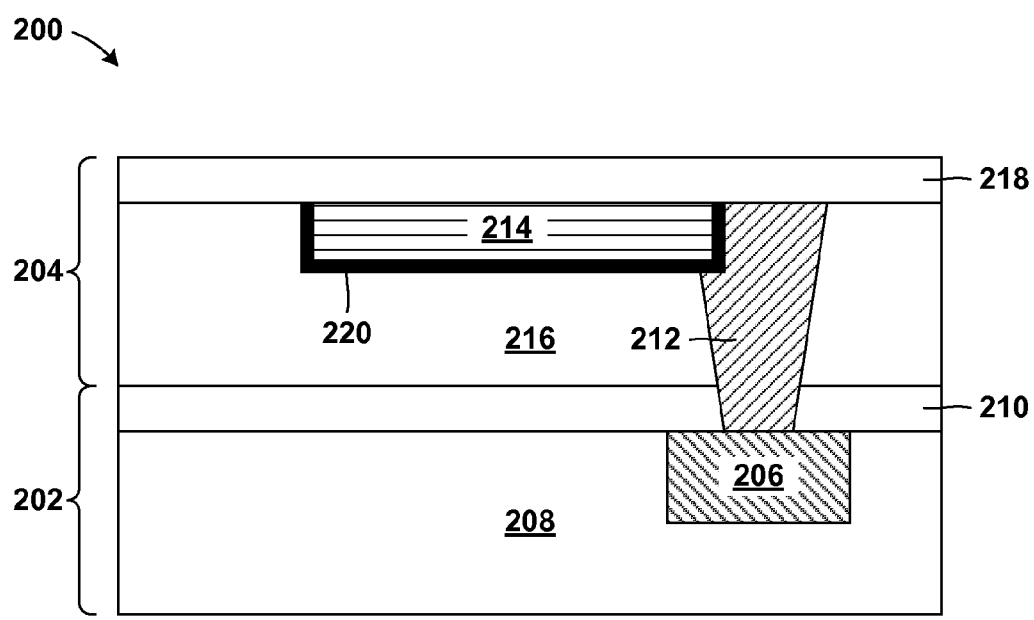
FIG. 8 illustrates a beginning structure according to an exemplary embodiment.

Referring now to FIG. 8, the method may begin with a structure 200. The structure 200 may include an $M_x$ level 202 and an $M_{x+1}$ level 204. The $M_x$ level 202 may include an $M_x$ metal 206, an $M_x$ dielectric layer 208, and an $M_x$ cap 210. The $M_x$ level 202 may represent any interconnect level in the structure 200. In an embodiment, the $M_x$ level 202 may represent a metallization level directly above a contact level or an active device level. The $M_{x+1}$ level 204, positioned directly above the $M_x$ level 202, may include an $M_{x+1}$ via 212, a first graphene line 214, an $M_{x+1}$ dielectric 216, and an $M_{x+1}$ cap 218. It should be noted that while only two interconnect levels are shown, in some embodiments the structure 200 may have multiple interconnect levels either above, below, or above and below the $M_x$ level 202 and the $M_{x+1}$ level 204.

The $M_x$ dielectric 208 may be substantially similar to the substrate 10 described above with reference to FIG. 1. In an embodiment, the $M_x$ dielectric 208 may include a dielectric material, for example, silicon oxide ($SiO_2$), silicon nitride ($Si_3N_4$), hydrogenated silicon carbon oxide (SiCOH), silicon based low k dielectrics, or porous dielectrics. Known deposition techniques, such as, for example, chemical vapor deposition, plasma enhanced chemical vapor deposition, atomic layer deposition, or physical vapor deposition may be used to form the $M_x$ dielectric 208. The $M_x$ dielectric 208 may have a typical thickness ranging from about 50 nm to about 450 nm and ranges there between, although a thickness less than 50 nm and greater than 450 nm may be acceptable.

The $M_x$ metal 206 may be substantially similar to the component 20 described above with reference to FIG. 1. In general, the $M_x$ metal 206 may be formed using any known technique, and may include any suitable conductive interconnect material, for example, copper, aluminum, or tungsten. The $M_x$ metal 206 may include a typical line or wire found in a typical semiconductor circuit. The $M_x$ metal 206 may be fabricated using, for example, a typical single or dual damascene technique in which a conductive interconnect material may be deposited in a trench formed in the $M_x$ dielectric 208.

In an embodiment, the $M_x$ metal 206 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition, atomic layer deposition, Copper reflow, or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 8, the $M_x$ cap 210 may be deposited over the structure 200 after formation of the $M_x$ metal 206. The $M_x$ cap 210 may electrically insulate the $M_x$ level 202 from additional interconnect levels that may be subsequently formed above the $M_x$ level 202, for example the $M_{x+1}$ level 204. The $M_x$ cap 210 may be used to improve interconnect reliability and prevent copper from diffusing into the $M_{x+1}$ dielectric 216 subsequently formed above. The $M_x$ cap 210 may be deposited using typical deposition techniques, for example, chemical vapor deposition. The $M_x$ cap 210 may include any dielectric material, for example, silicon nitride ($Si_3N_4$), silicon carbide (SiC), silicon carbon nitride (SiCN), hydrogenated silicon carbide (SiCH), or other known capping materials. The cap can be a hybrid of any metal and dielectric material mentioned above, such as, for example, Cobalt and Nblok. The $M_x$ cap 210 may have a thickness ranging from about 15 nm to about 55 nm and ranges therebetween, although a thickness less than 15 nm and greater than 55 nm may be acceptable.

Next, the $M_{x+1}$ level 204 may be formed above the $M_x$ level 202. First, the $M_{x+1}$ dielectric 216 may be deposited on top of the $M_x$ cap 210. The $M_{x+1}$ dielectric 216 may be substantially similar in all respects to the $M_x$ dielectric layer 208 described above. Next, the $M_{x+1}$ via 212 and the first graphene line 214 may be formed in accordance with the techniques described above. More specifically, the first graphene line 214 may be substantially similar to the graphene 30 described above with reference to FIG. 5, and the $M_{x+2}$ via 212 may be substantially similar to the VIA 16 described above with reference to FIG. 1. In an embodiment, the first graphene line 214 may be made of multiple layers of graphene and the $M_{x+1}$ via 212 may be made of aluminum, copper, or tungsten according to the techniques described above. Also, like above the $M_{x+1}$ via 212 may have a barrier layer (not shown) similar to the barrier layer of the $M_x$ metal 206. It should be noted that the first graphene line 214 does not contain any dopants to improve conductivity and as such may remain substantially undoped.

More specifically, after forming the $M_{x+1}$ via 212, the first graphene line 214 may be fabricated by first etching a trench in the $M_{x+1}$ dielectric 216. The trench may intentionally overlap or intersect with the $M_{x+1}$ via 212 such that a portion of the conductive interconnect material of the $M_{x+1}$ via 212 is exposed. In an embodiment, the trench may have a depth less than or equal to about 50% of the height of a typical metal interconnect, such as, for example the $M_x$ metal 206. In an embodiment, the trench may have a depth ranging from about 25 nm to approximately 80 nm, measured from the top surface of the $M_{x+1}$ dielectric 216, although greater and lesser thicknesses are explicitly contemplated. The trench may be formed by known anisotropic etching techniques, including, for example, reactive ion etching (RIE) or plasma etching. Exemplary etching techniques may be, for example, fluorine-based, including, for example, $CF_4$ plasma etching.

After the trench is formed a barrier layer (not shown) and a seed layer 220 may be conformally deposited above the structure 200 and within the line trench. The barrier layer may improve adherence of the seed layer 220 to a bottom and a sidewall of the trench, and serve as an electromigration barrier between the first graphene line 214 subsequently formed in the trench and the $M_{x+1}$ via 212. The barrier layer may be substantially similar to other barrier layers described above and may include, for example tantalum, tantalum nitride, titanium, titanium nitride, or combinations thereof. The seed layer 220 may be any material capable of aiding or supporting the formation of the first graphene line 214. In an exemplary embodiment, a ruthenium seed layer may be used. Alternatively, the seed layer 220 may include ruthenium, nickel, palladium, iridium, copper, or any combination thereof. The most appropriate seed layer 220 material may depend on the specific graphene deposition or growth process used. The seed layer 220 may alternatively be referred to as a catalyst layer used to support the formation of the first graphene line 214.

With continued reference to FIG. 1, the structure 200 may undergo a planarization technique, for example, chemical-mechanical planarization (CMP), to remove excess material of the barrier layer and the seed layer 220 from above the $M_{x+1}$ dielectric 216. Not only are the materials of the barrier layer and the seed layer 220 polished, but the conductive interconnect material of the $M_{x+1}$ via 212 and the dielectric material of the $M_{x+1}$ dielectric 216 are also polished. After planarization, the depth of the trench may be reduced to a range from about 2 nm to about 5 nm, including the thickness of the barrier layer and the seed layer 220, although greater and lesser depths are explicitly contemplated.

Next, the first graphene line 214 may be formed in the trench, such that it abuts and is electrically connected to the $M_{x+1}$ via 212 while being physically separated from the $M_{x+1}$ via 212 by the barrier layer. The first graphene line 214 may be formed using any method known in the art capable of forming a graphene region that conducts electricity to and from the $M_{x+1}$ via 212. In an exemplary embodiment, the first graphene line 214 may include multiple layers of graphene deposited using CVD with either solid or liquid precursors at a temperature ranging from about 300° C. to about 400° C., although greater and lesser temperatures are explicitly contemplated. It may be preferable to use a graphene formation process within this temperature range or lower to avoid damage to other elements of the structure 200. However, graphene formation processes that require higher temperatures may also be acceptable. In particular, a person of ordinary skill in the art will appreciate that the formation techniques and process temperatures used to form the first graphene line 214 may easily be integrated in to current semiconductor process flows. A multilayer graphene line may be preferable for redundancy in case some of the layers are damaged during formation to the extent that they will not conduct electricity.

In an embodiment, a multilayer graphene line may have anywhere from 5 to 20 layers of graphene.

Graphene may be a suitable material from which to form an interconnect structure, unlike carbon nanotubes, because of its 2D characteristics. For example, carbon nanotubes, which have a similar composition to graphene, however packaged in a different shape, may not be suitable to form the first graphene line 214. In particular, carbon nanotubes are substantially one dimensional as opposed to graphene layers which are substantially two dimensional, thus affecting electron mobility. Also, purification processes and processing temperatures in excess of 3000° C. may be required to fabricate carbon nanotubes, which may be detrimental to surrounding structures existing at the time of fabrication.

The first graphene line 214 may electrically connect the $M_{x+1}$ via 212 with another via subsequently formed in a metallization level above the first graphene line 214 or with another metal fuse formed in the $M_{x+1}$ level 204. In general, current may travel parallel to the length of the first graphene line 214. In embodiments where the first graphene line 214 is made of multi-layer graphene, current may travel from one graphene layer into another or between adjacent graphene layers. As is appreciated by one of ordinary skill in the art, current traveling between adjacent graphene layers will experience a higher resistance than current traveling in a single graphene layer parallel to the length of the first graphene line 214. As such, current may travel primarily in the direction parallel to the length of the first graphene line 214. Next, the $M_{x+1}$ cap 218 may be deposited over the structure 200 after formation of the first graphene line 214. The $M_{x+1}$ cap 218 may be substantially similar in all respects to the $M_x$ cap 210 described above.

Figure 9:
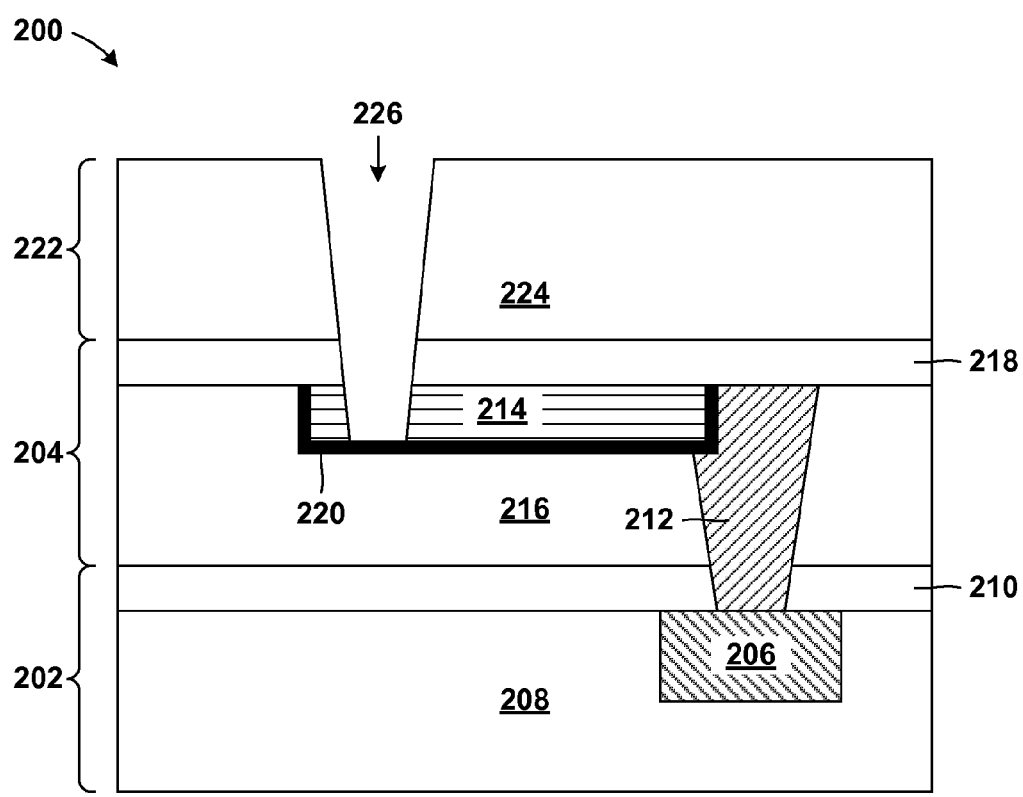
FIG. 9 illustrates forming a trench according to an exemplary embodiment.

Referring now to FIG. 9, an $M_{x+2}$ level 222 may be formed above the an $M_{x+1}$ level 204. $M_{x+2}$ level 222 may include an $M_{x+2}$ dielectric 224 in which a via opening 226 may be formed according to known techniques. More specifically, the via opening 226 may be formed by etching through the $M_{x+2}$ dielectric 224, through the $M_{x+1}$ cap 218, and etching into a portion of the first graphene line 214 to expose the seed layer 220. It should be noted that the seed layer 220 need not be exposed, however, it may be used as an etch stop in which it will likely be exposed. In an embodiment, the via opening 226 may be patterned using a photoresist and etched using a soft non-bombarding etch, for example, a dry anisotropic etching technique. Several reports in literature highlight the use of either hydrogen or oxygen plasma as being capable of controllably etching mono-layer graphene. In an embodiment, a low pressure and low power plasma with a relatively slow etch rate may be used to control the etch depth and critical dimensions of the via opening 226 in the first graphene line 214. The via opening 226 may preferably extend some depth into the graphene line 214 to expose an end of the second graphene material. In embodiments where the first graphene line 214 is made of multiple layers of graphene, it is preferable to expose an end of each of the multiple graphene layers, if not all of them. Because, as mentioned above, the electrical path having the least resistance is along the length of the graphene, any electrical connection to or from the first graphene line 214 may preferably be formed at the ends of the graphene material. It is conceivable that a particular design may locate the via opening 226 at any point along the length of the first graphene line 214, including at or near one end, or some distance from either end.

Figure 10:
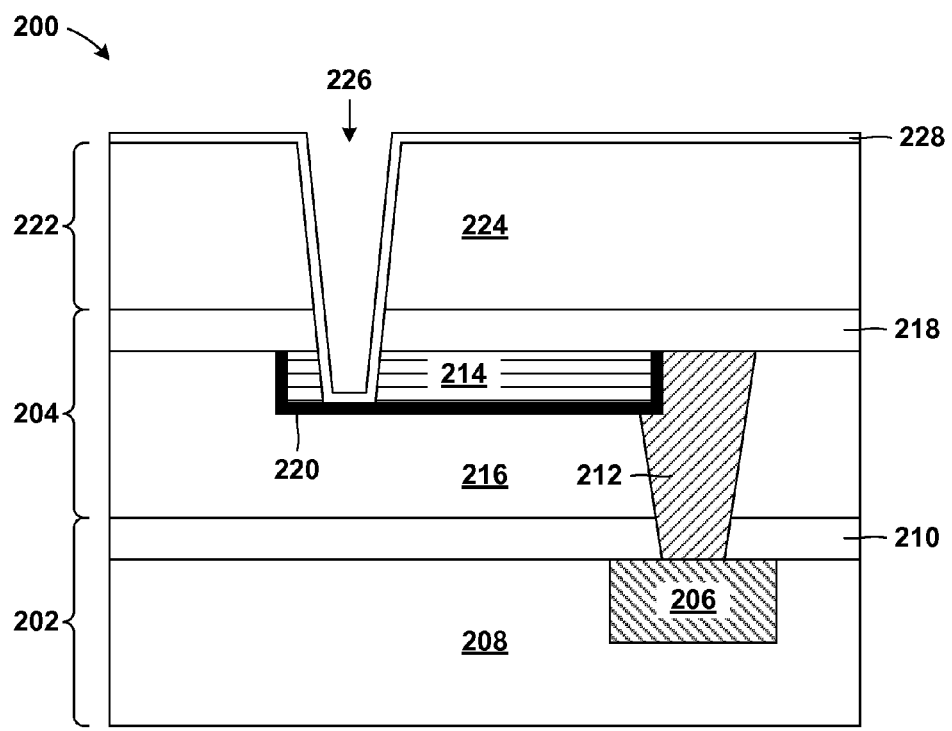
FIG. 10 illustrates forming a palladium liner within the trench according to an exemplary embodiment.

Referring now to FIG. 10, a liner 228 followed by a barrier layer (not shown) may be conformally formed directly on top of the structure 200 and within the via opening 226. The liner 228 may include palladium, platinum, or copper deposited using any known deposition technique, such as, for example, an atomic layer deposition technique or a low pressure chemical vapor deposition technique. In the present example, the liner 228 is deposited within the via opening 226 in direct contact with the $M_{x+2}$ dielectric 224 and the $M_{x+1}$ cap 218, and more specifically, in direct contact with the ends of the two dimensional graphene layers of the first graphene line 214. The liner 228 may have a conformal thickness ranging from about 0.5 nm to about 5 nm, and more particularly about 1 nm.

The palladium-graphene interface has a relatively small interface distance promoting higher probability of electron conduction. Further, cohesive energy and carbon spacing is optimized for a palladium-graphene interface. Palladium is particularly advantageous due to the unique bonds which form conduction bands between palladium and graphene, in turn lowering the resistance at the interface between the palladium liner 228 and the first graphene line 214. Palladium-graphene interfaces may, in general, exhibit good conductivity with relatively low resistance; however, integrating the same into a copper damascene process flow, as described herein, is unique. Improves conductivity with further reduces resistance may be achieved by forming a palladium-graphene interface at the ends of a two dimensional multilayered graphene line. More specifically, the palladium-graphene interface between the first graphene line 214 and the liner 228 has improved conductivity and reduced resistance.

The barrier layer formed within the via opening 226 may be substantially similar to all other barrier layers described above. In an embodiment, the barrier layer may include cobalt, ruthenium, tantalum, tantalum nitride, indium oxide, tungsten nitride, titanium nitride, or some combination thereof. In a particular example, the barrier liner may include, for example, a tantalum nitride (TaN), followed by an additional layer including tantalum (Ta).

Figure 11:
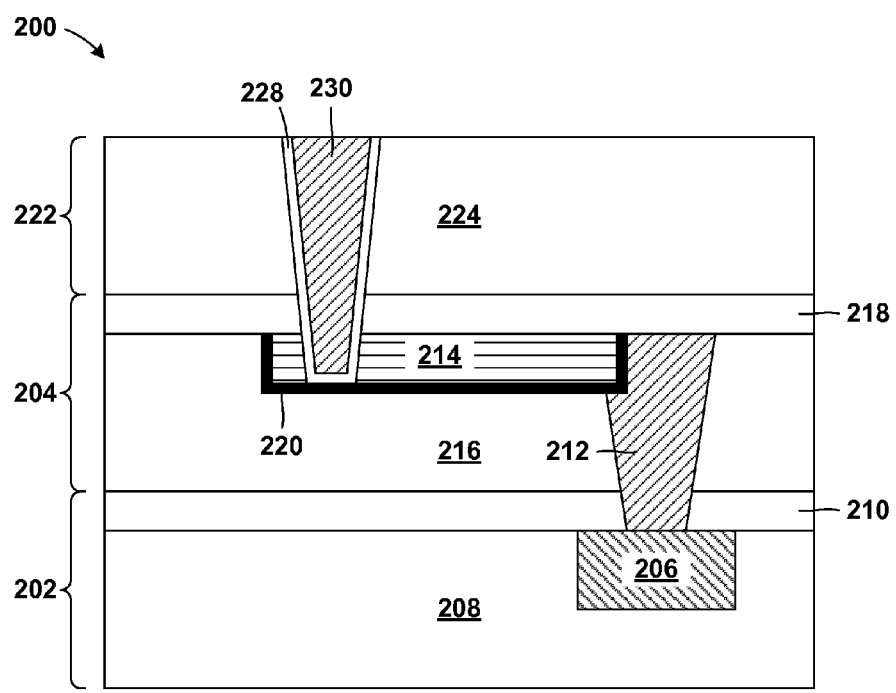
FIG. 11 illustrates filling the trench, on top of the palladium liner, with a conductive interconnect material according to an exemplary embodiment.

Referring now to FIG. 11, a conductive interconnect material may be deposited within the via opening 226 (FIG. 10) on top of the barrier layer according to known techniques. The conductive interconnect material may include, for example, gold, copper, aluminum, or tungsten. In an embodiment, the conductive interconnect material may further include a dopant, such as, for example, manganese (Mn), magnesium (Mg), copper (Cu), aluminum (Al) or other known dopants. Typically, after deposition, excess conductive interconnect material may remain above the entire structure 200 and a chemical mechanical polishing technique may be used to polish the structure and remove any excess material conductive interconnect material to form an $M_{x+2}$ via 234. Furthermore, excess material of the barrier layer and the seed layer 220 may be simultaneously removed using the same polishing technique. After polishing, a top surface of the $M_{x+2}$ via 230 may be substantially flush with a top surface of the $M_{x+2}$ dielectric 224.

Figure 12:
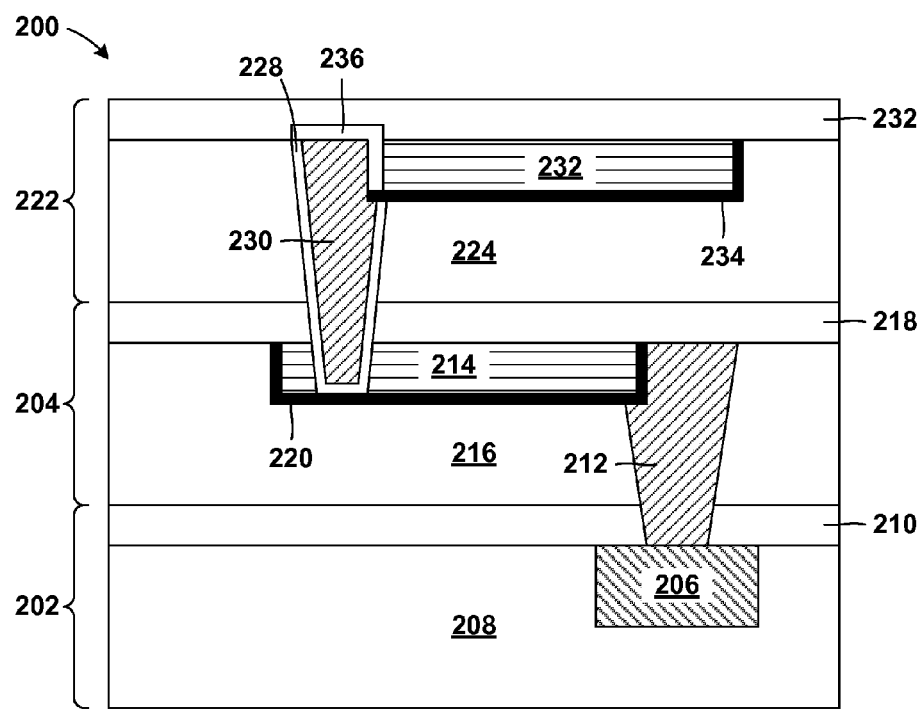
FIG. 12 illustrates forming a metal cap and a final structure according to an exemplary embodiment.

Referring now to FIG. 12, a second graphene line 232 may be formed in accordance with the techniques described above, and may be substantially similar to the graphene 30 and the first graphene line 232 described above with reference to FIGS. 5 and 9, respectively. More specifically, after forming the $M_{x+2}$ via 230, the second graphene line 232 may be fabricated by first etching a trench in the $M_{x+2}$ dielectric 224. Like above, the trench may intentionally overlap or intersect with the $M_{x+2}$ via 230 such that a portion of the conductive interconnect material of the $M_{x+2}$ via 230 is exposed. The second graphene line 232 may also include a seed layer 234 similar to the seed layer 220 described above. Furthermore, either the first graphene line 214, the second graphene line 232, or both include one or more graphene sheets oriented horizontally parallel with the first and second interconnect levels.

Due to known limitations in lithography the overlap between the trench and the $M_{x+2}$ via 230 may be deliberately large enough to guarantee direct contact between the conductive interconnect material of the $M_{x+2}$ via 230 and the second graphene line 232; however, doing so may cause a portion of the liner 228 to be removed from between the $M_{x+2}$ via 230 and the second graphene line 232. Therefore additional measures must be taken to ensure low resistance contact between the $M_{x+2}$ via 230 and the second graphene line 232. It should be noted that in some instances, it is conceivable that the liner 228 may be preserved and remain between the $M_{x+2}$ via 230 and the second graphene line 232 after etching the trench.

In order to preserve the additional benefits of the liner 228 with respect to the electrical connection between the $M_{x+2}$ via 230 and the second graphene line 232, a wet clean or wet etching technique may be used to expose at least a portion of one end of the second graphene line 232. A block mask may be used to define the contact regions that will be processed. In an embodiment, an aqua regia wet etching technique may be used to expose at least a portion of one end of the second graphene line 232. In doing so, at least a small portion of the seed layer 234 may be removed, and in some instances a small portion of the barrier layer or the interconnect material, both of the $M_{x+2}$ via 230, may also be removed. The primary goal is to expose the end of the two dimensional graphene material of the second graphene line 232. In a preferred embodiment, the ends of multiple layers of graphene are exposed by removing a portion of the seed layer 234.

Once the end of the graphene layers the second graphene line 232 are exposed, a metal cap 236 may be selectively deposited on an exposed surface of the conductive interconnect material of the $M_{x+2}$ via 230, replacing the small portion of the seed layer 234 removed above. In an embodiment, the metal cap 236 may include palladium deposited using an electrodeposition technique. More specifically, the palladium metal cap 236 may be in direct contact with both the conductive interconnect material of the $M_{x+2}$ via 230 and the ends of the graphene layers of the second graphene line 232 to form a low resistance interface. In other words, the palladium metal cap 236 may extend across the top surface of the $M_{x+2}$ via 230 and down a vertical interface between the $M_{x+2}$ via 230 and the second graphene line 232.

In general, current flows from the $M_{x+1}$ via 212 to up to the first graphene line 214. An ohmic contact may exist between a liner of the $M_{x+1}$ via 212 and seed layer 220. From the seed layer 220 current travels to the ends the first graphene line 214 with lowest possible resistance. Then, from the first graphene line 214, current flows to the liner 228 and travels up to the palladium metal cap 236 which has low contact resistance to the second graphene line 232.

Finally, with continued reference to FIG. 12, an $M_{x+2}$ cap 232 may be formed directly above the $M_{x+2}$ via 230, the metal cap 236, the second graphene line 232, and the $M_{x+2}$ dielectric 224 according to known techniques. The $M_{x+2}$ via 234 may be substantially similar to the $M_x$ cap 210 and the $M_{x+1}$ cap 218 described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    a first metal line in a first interconnect level, the first metal line comprising one or more graphene portions;
    a second metal line in a second interconnect level above the first interconnect level, the second metal line comprising one or more graphene portions;
    a metal via comprising a palladium liner extending vertically and electrically connecting the first metal line with the second metal line, the metal via is at least partially embedded in the first metal line such that the palladium liner is in direct contact with at least an end portion of the one or more graphene portions of the first metal line; and
    a palladium cap in direct contact with a conductive interconnect material of the metal via and an end portion of the one or more graphene portions of the second metal line.

2. The structure of claim 1, wherein the one or more graphene portions of both the first and second metal lines comprises a graphene sheet oriented horizontally parallel with the first and second interconnect levels, respectively.

3. The structure of claim 1,
    wherein the palladium cap extends across a top surface of the metal via and down a vertical interface between the metal via and the second metal line.

4. The structure of claim 1, further comprising:
    a first seed layer in direct contact with a side and a bottom of the first metal line; and
    a second seed layer in direct contact with a side and a bottom of the second metal line,
    wherein the first and second seed layers comprise ruthenium, nickel, palladium, iridium, copper, or any combination thereof.

5. The structure of claim 1, wherein the palladium liner of the metal via is in direct contact with a seed layer extending along a side and a bottom of the first metal line, the seed layer comprises ruthenium, nickel, palladium, iridium, copper, or any combination thereof.

6. The structure of claim 1, wherein the metal via further comprises a barrier layer comprising tantalum, tantalum nitride, titanium, titanium nitride or any combination thereof, the barrier layer is in direct contact with the palladium liner and the conductive interconnect material of the metal via.

7. A method comprising:
    forming a first metal line in a first interconnect level, the first metal line comprising one or more graphene portions;
    forming a second metal line in a second interconnect level above the first interconnect level, the second metal line comprising one or more graphene portions;
    forming a metal via comprising a palladium liner extending vertically and electrically connecting the first metal line with the second metal line, the metal via is at least partially embedded in the first metal line such that the palladium liner is in direct contact with at least an end portion of the one or more graphene portions of the first metal line; and
    replacing a portion of a non-palladium seed layer of the second metal line with a palladium cap in direct contact with a top surface of the metal via and an end portion of the one or more graphene portions of the second metal line, the non-palladium seed layer is in direct contact with and extends along a side and a bottom of the second metal line.

8. The method of claim 7, wherein the one or more graphene portions of both the first and second metal lines comprises a graphene sheet oriented horizontally parallel with the first and second interconnect levels, respectively.

9. The method of claim 7, further comprising:
removing a portion of a seed layer to expose the end portion of the one or more graphene portions of the second metal line, the seed layer is in direct contact with and extends along a side and a bottom of the second metal line; and
selectively depositing a palladium cap in direct contact with a conductive interconnect material of the metal via and the end portion of the one or more graphene portions of the second metal line.

10. The method of claim 7, further comprising:
removing a portion of a seed layer to expose the end portion of the one or more graphene portions of the second metal line, the seed layer is in direct contact with and extends along a side and a bottom of the second metal line; and
selectively depositing a palladium cap in direct contact with a conductive interconnect material of the metal via and the end portion of the one or more graphene portions of the second metal line, the palladium cap extending across a top surface of the metal via and down a vertical interface between the metal via and the second metal line.

11. The method of claim 7, wherein the palladium liner of the metal via is in direct contact with a first seed layer, the first seed layer is in direct contact with a side and a bottom of the first metal line.

12. A method comprising:
etching, in a first dielectric layer, a first trench;
filling the first trench with graphene;
etching in a second dielectric layer a via opening, the second dielectric layer is above the first dielectric layer, and at least an end portion of the graphene in the first trench is exposed along a sidewall at a bottom of the via opening;
depositing, conformally, a layer of palladium within the via opening;
filling the via opening with a conductive interconnect material;
etching, in the second dielectric layer, a second trench which intersects with, and at least partially removes a portion of, the conductive interconnect material in the via opening; and
filling the second trench with graphene.

13. The method of claim 12, wherein the graphene of both the first and second metal lines comprises a graphene sheet oriented horizontally parallel with the first and second interconnect levels, respectively.

14. The method of claim 12, further comprising:
replacing a portion of a non-palladium seed layer of the second trench with a palladium cap in direct contact with a top surface of the conductive interconnect material and an end portion of the graphene in the second trench, the non-palladium seed layer is in direct contact with and extends along a side and a bottom of the second trench.

15. The method of claim 12, further comprising:
removing a portion of a seed layer to expose the end portion of the graphene of the second trench, the seed layer is in direct contact with and extends along a side and a bottom of the second trench; and
selectively depositing a palladium cap in direct contact with the conductive interconnect material and the end portion of the graphene of the second trench, the palladium cap extending across a top surface of the conductive interconnect and down a vertical interface between the conductive interconnect material and the second trench.

16. The method of claim 12, wherein the layer of palladium within the via opening is in direct contact with a seed layer, the seed layer is in direct contact with a side and a bottom of the first metal line.

17. The method of claim 12, wherein etching the via opening in a second dielectric layer comprises:
exposing a seed layer in direct contact with a side and a bottom of the first trench.

18. The method of claim 12, wherein filling the first trench and the second trench with graphene comprises:
using a chemical vapor deposition process to deposit multilayer graphene sheets oriented horizontally parallel with the first and second interconnect levels, respectively.

* * * * *